US011573054B2

(12) United States Patent
Craig

(10) Patent No.: US 11,573,054 B2
(45) Date of Patent: Feb. 7, 2023

(54) THERMAL MANAGEMENT FOR MODULAR ELECTRONIC DEVICES

(71) Applicant: CommScope Technologies LLC, Hickory, NC (US)

(72) Inventor: Kevin E. Craig, Dudley, MA (US)

(73) Assignee: CommScope Technologies LLC, Hickory, NC (US)

( * ) Notice: Subject to any disclaimer, the term of this patent is extended or adjusted under 35 U.S.C. 154(b) by 452 days.

(21) Appl. No.: 16/674,794

(22) Filed: Nov. 5, 2019

(65) Prior Publication Data
US 2020/0191498 A1    Jun. 18, 2020

Related U.S. Application Data

(60) Provisional application No. 62/781,151, filed on Dec. 18, 2018.

(51) Int. Cl.
*H05K 7/20* (2006.01)
*F28D 15/02* (2006.01)
*H01L 23/427* (2006.01)

(52) U.S. Cl.
CPC ..... *F28D 15/0275* (2013.01); *F28D 15/0233* (2013.01); *H01L 23/427* (2013.01);
(Continued)

(58) Field of Classification Search
CPC ............... H05K 7/205; H05K 7/20672; H05K 7/20809; F28D 15/0275
See application file for complete search history.

(56) References Cited

U.S. PATENT DOCUMENTS

| 6,118,654 A | 9/2000 | Bhatia |
| 6,424,528 B1 | 7/2002 | Chao |

(Continued)

FOREIGN PATENT DOCUMENTS

| KR | 200485269 Y1 | 12/2017 |
| WO | 03077626 A1 | 9/2003 |

OTHER PUBLICATIONS

Loh et al., "Comparative Study of Heat Pipes Performances in Different Orientations", Semiconductor Thermal Measurement and Management IEEE Twenty First Annual IEEE Symposium, 2005, pp. 1-5, IEEE.

(Continued)

*Primary Examiner* — Leonard R Leo
(74) *Attorney, Agent, or Firm* — Fogg & Powers LLC

(57) ABSTRACT

Thermal management for modular electronic devices is provided. In one embodiment, a modular electronic device comprises: a primary electronics assembly comprising a least one module bay configured to receive a pluggable electronics module, wherein the pluggable electronics module comprises at least one heat conduction riser that protrudes from the pluggable electronics module; a heat management mechanism coupled to the primary electronics assembly, wherein the heat management mechanism includes at least one floating heat sink thermally coupled to the heat conduction riser of the pluggable electronic module by a heat pipe that defines a direct thermal conductive heat path between the pluggable electronics module and the floating heat sink. The heat pipe is mounted to the primary electronics assembly by a spring loaded floating heat pipe interface that applies a clamping force against the heat pipe, and maintains contact between the interface and the heat conduction riser.

20 Claims, 7 Drawing Sheets

(52) U.S. Cl.
CPC ......... *H05K 7/205* (2013.01); *H05K 7/20336* (2013.01); *H05K 7/20672* (2013.01); *H05K 7/20809* (2013.01); *H05K 2201/066* (2013.01)

(56) References Cited

U.S. PATENT DOCUMENTS

| | | | |
|---|---|---|---|
| 6,912,785 | B2 | 7/2005 | Mitchell |
| 7,143,819 | B2 | 12/2006 | Malone et al. |
| 7,342,788 | B2 | 3/2008 | Nikfar |
| 7,764,504 | B2 * | 7/2010 | Phillips .............. H01R 13/6582 174/15.2 |
| 8,081,470 | B2 * | 12/2011 | Oki ...................... G02B 6/4201 165/185 |
| 8,270,170 | B2 | 9/2012 | Hughes et al. |
| 8,817,469 | B2 * | 8/2014 | Macall ................. G02B 6/4261 361/708 |
| 9,668,378 | B2 * | 5/2017 | Phillips .............. H05K 7/20418 |
| 10,121,727 | B1 * | 11/2018 | Lucas .................. G02B 6/3897 |
| 10,884,203 | B2 * | 1/2021 | Chanu .................. G02B 6/4268 |
| 11,266,043 | B2 * | 3/2022 | Chen ........................ G06F 1/206 |
| 2005/0201061 | A1 | 9/2005 | Nikfar |
| 2008/0043425 | A1 | 2/2008 | Hebert et al. |
| 2010/0208430 | A1 | 8/2010 | Huang et al. |
| 2013/0077232 | A1 | 3/2013 | Nordin et al. |
| 2014/0160679 | A1 | 6/2014 | Kelty |
| 2015/0092363 | A1 | 4/2015 | Blier et al. |
| 2015/0382508 | A1 | 12/2015 | Tatta et al. |
| 2017/0196122 | A1 | 7/2017 | Chen et al. |
| 2017/0347488 | A1 | 11/2017 | Wu et al. |

OTHER PUBLICATIONS

Thayer, "Analysis of a Heat Pipe Assisted Heat Sink", at least as early as 2011, pp. 1-6, Lancaster, PA.
International Searching Authority, "International Search Report and Written Opinion from PCT Application No. PCT/US2019/059905", from Foreign Counterpart to U.S. Appl. No. 16/674,794, dated Feb. 24, 2020, pp. 1-9, Published; US.
European Patent Office, "Extended European Search Report from U.S. Appl. No. 16/674,794, filed Jun. 29, 2022", from Foreign Counterpart to U.S. Appl. No. 16/674,794, dated Jun. 29, 2022, pp. 1 through 16, Published: EP.

* cited by examiner

THERMAL MANAGEMENT FOR MODULAR ELECTRONIC DEVICES

CROSS-REFERENCE TO RELATED APPLICATIONS

This U.S. Patent Application claims priority to, and the benefit of, U.S. Provisional Patent Application No. 62/781,151, titled "THERMAL MANAGEMENT FOR MODULAR ELECTRONIC DEVICES" filed on Dec. 18, 2018, which is hereby incorporated by reference in its entirety.

BACKGROUND

Electronics components, such as power amplifiers used in radio frequency communications electronics, can generate a substantial amount of heat. This heat needs to be dissipated out of the electronics into the ambient environment in order for the electronics to be able to continue to operate within their rated thermal tolerances. Heat pipes are devices which may be mounted directly to components that need to be cooled. Heat pipes represent one thermal management technology which may be used to efficiently transport heat away from such components to heat sinks, which can efficiently transfer that heat into the environment. However, communications electronics are increasingly modular in design in order to support the ability to reconfigure the electronics for different and evolving operating parameters, such as frequency bands, modulation schemes, and the like. That is, the electronics may be reconfigured for new or enhanced functionality by unplugging existing electronic modules and replacing them with new electronic modules. When electronic components mounted within such replaceable modules are the source of significant heat, the physical mounting of heat pipes to those components to transport heat away may no longer be feasible.

SUMMARY

The embodiments of the present disclosure provide methods and systems for thermal management for modular electronic devices and will be understood by reading and studying the following specification.

In one embodiment, a modular electronic device comprises: a primary electronics assembly comprising a least one module bay configured to receive a pluggable electronics module, wherein the pluggable electronics module comprises at least one heat conduction riser that protrudes from the pluggable electronics module; a heat management mechanism coupled to the primary electronics assembly, wherein the heat management mechanism includes at least one floating heat sink thermally coupled to the at least one heat conduction riser of the pluggable electronic module by a heat pipe that defines a direct thermal conductive heat path between the pluggable electronics module and the at least one floating heat sink; wherein the heat pipe is mounted to the primary electronics assembly by a spring loaded floating heat pipe interface that applies a clamping force against the heat pipe, and maintains contact between the spring loaded floating heat pipe interface and the at least one heat conduction riser.

DRAWINGS

Embodiments of the present disclosure can be more easily understood and further advantages and uses thereof more readily apparent, when considered in view of the description of the preferred embodiments and the following figures in which.

In accordance with common practice, the various described features are not drawn to scale but are drawn to emphasize features relevant to the present disclosure. Reference characters denote like elements throughout figures and text.

DETAILED DESCRIPTION

In the following detailed description, reference is made to the accompanying drawings that form a part hereof, and in which is shown by way of specific illustrative embodiments in which the embodiments may be practiced. These embodiments are described in sufficient detail to enable those skilled in the art to practice the embodiments, and it is to be understood that other embodiments may be utilized, and that logical, mechanical and electrical changes may be made without departing from the scope of the present disclosure. The following detailed description is, therefore, not to be taken in a limiting sense.

Figure 1:
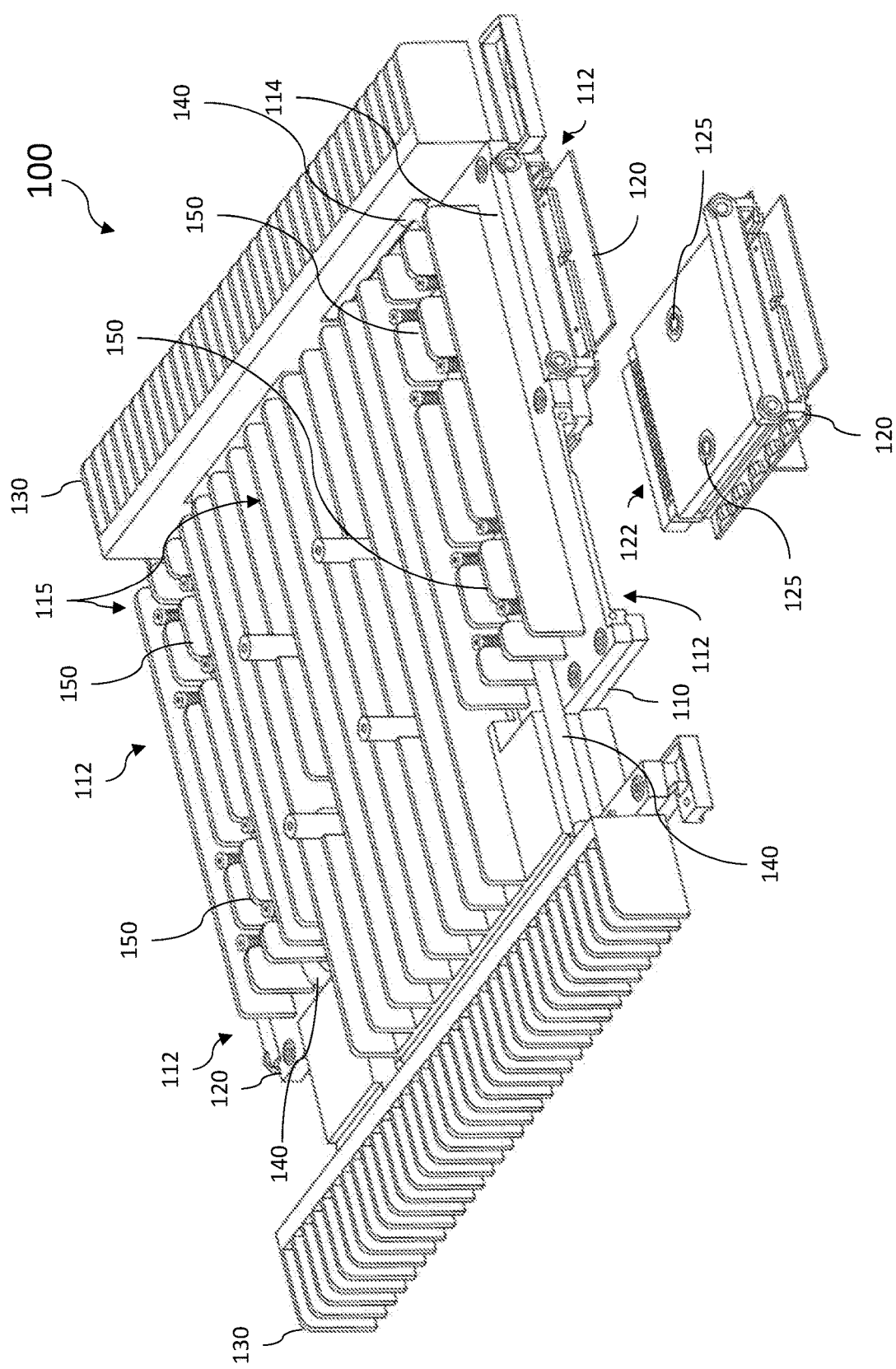
FIG. 1 is diagram illustrating an example modular electronic device embodiment.

FIG. 1 is a diagram of a modular electronic device 100. Device 100 includes a primary electronics assembly 110 which may comprise one or more electronics elements such as, but not limited to, discreet electronic components, active components, passive components, analog and digital integrated circuits, amplifiers, processors and the like.

The modular electronic device 100 utilizes one or more pluggable electronics modules 120 that are each configured for insertion into a module bays 112 of the primary electronics assembly 110. Installation of an electronics module 120 by plugging it into a module bay 112 electrically couples at least some of the electronic components of the electronics module 120 with at least some of the electronics elements of the primary electronics assembly 110 via a connection interface 122 on the electronics module 120. The connection interface 122 mates with a compatible interface on the primary electronics assembly 110 (not shown). The modular electronic device 100 shown in FIG. 1 includes multiple module bays 112 for accommodating a corresponding number of multiple electronics modules 120. However, it should be understood that in different embodiments, a modular electronic device 100 may be designed for use with any number of one or more electronics modules 120. Each electronics module 120 may include discreet electronic components, active components, passive components, analog and digital integrated circuits, amplifiers (including RF power amplifiers), processors and the like. It should be understood that the several electronics modules 120 used in conjunction with a modular electronic device 100 need not be identical, but may comprise different electronic components providing different functionalities to the modular electronic device 100.

In the embodiment shown in FIG. 1, modular electronic device 100 includes two distinct mechanisms for managing heat generated by the primary electronics assembly 110 and the electronics module(s) 120. The first heat management mechanism is a fixed heat sink 114 and may optionally comprise a plurality of heat sink fins 115 extending out from the primary electronics assembly 110. The fixed heat sink 114 may be either rigidly attached to the primary electronics assembly 110, or may be an integrated element comprising part of the structure of the primary electronics assembly 110. As such, at least some heat generated by the electronics elements on the primary electronics assembly 110 has a direct thermal conductive heat path to the heat sink 114 (and optional fins 115) in order to dissipate at least some heat generated by those elements. The need for, or size of, the fixed heat sink 114, typically depends at least in part on the amount of heat generated by the primary electronics assembly 110 such that in some embodiments the fixed heat sink 114 may be eliminated, or may be sized to cover only a limited region of the primary electronics assembly 110.

The second heat management mechanism for device 100 comprises one or more floating heat sinks 130 which serve the function of drawing and dissipating at least some heat generated by the pluggable electronics module(s) 120. More specifically, each floating heat sink 130 is thermally coupled to an electronics module 120 by a heat pipe 140 that defines a direct thermal conductive heat path between the electronics module 120 and the floating heat sink 130.

Figure 1A:
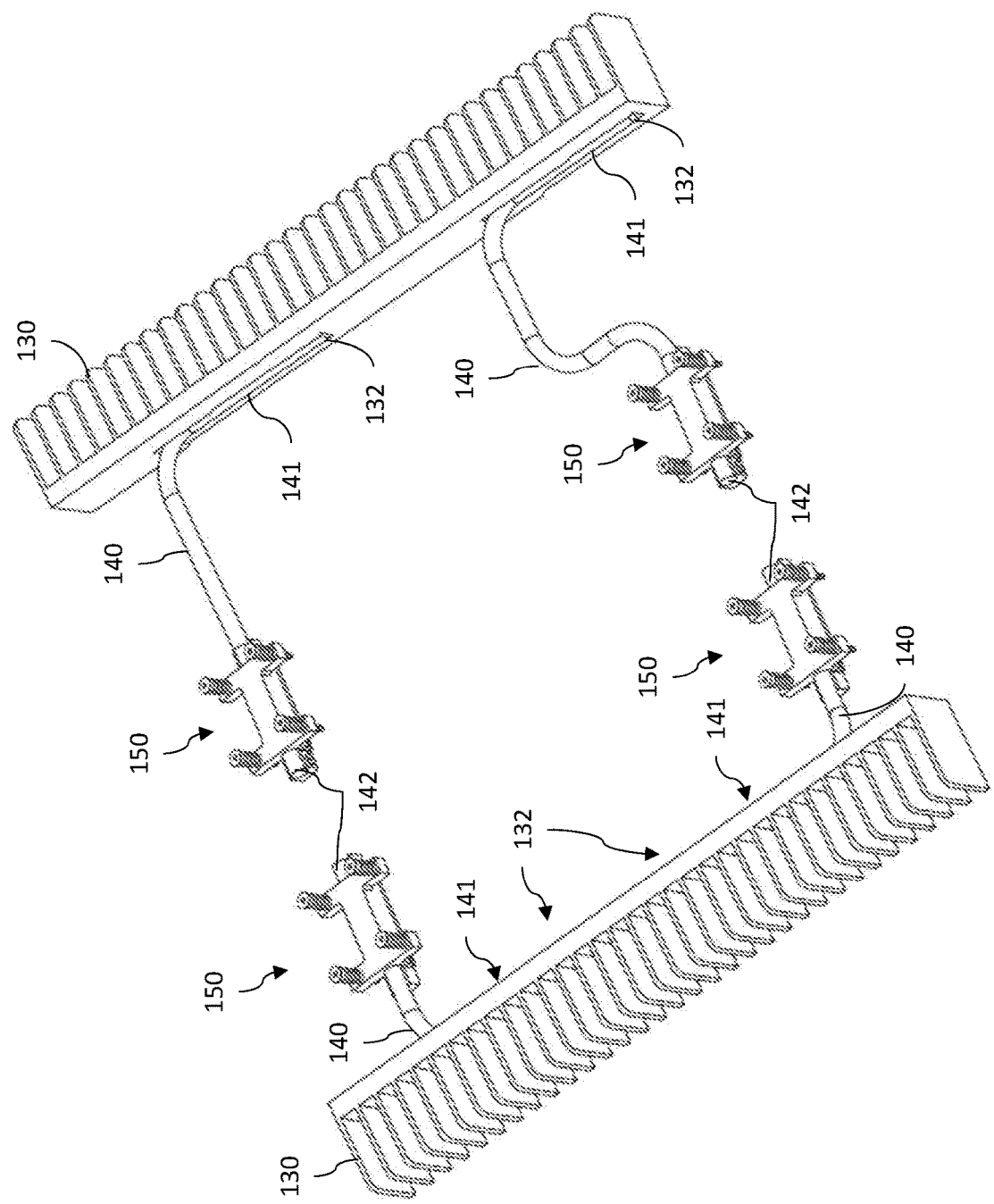
FIG. 1A is a diagram illustrating floating heat sinks in conjunction with heat pipes for an example embodiment.
Figure 1B:
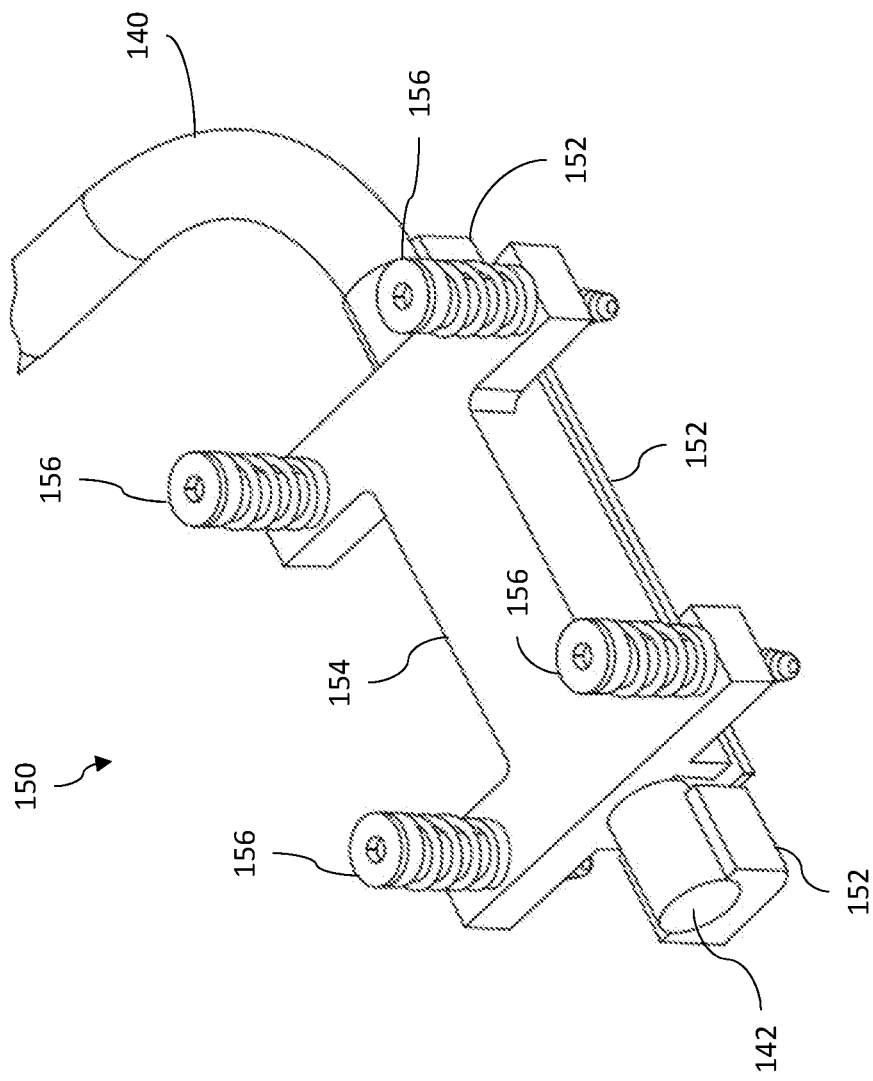
FIG. 1B is a diagram illustrating an example floating heat pipe interface embodiment.

FIG. 1A shows an alternate view of the modular electronic device 100 of FIG. 1, where the primary electronics assembly 110 is not shown to better emphasize certain details of the floating heat sinks 130. In this figure, each floating heat sink 130 includes one or more cavities 132 shaped to receive an first section 141 of an end section of a heat pipe 140. An opposing second segment 142 that is an opposing end section of each heat pipe 140 is secured to the primary electronics assembly 110 by a floating heat pipe interface 150. As shown in greater detail in FIG. 1B, for each heat pipe 140, the segment 142 is positioned between a base member 152 and a clamping member 154 of the floating heat pipe interface 150. A clamping force is applied to secure the heat pipe 140 within the floating heat pipe interface 150 by a plurality of fasteners 156 that pass through the clamping member 154 and fasten into the primary electronics assembly 110. For example, in one embodiment the one or more of the fasteners 156 may comprise a threaded fastener that applies a clamping force onto the clamping member 154 as they are tightened in place. In some embodiments, the fasteners 156 are spring loaded. For example, in the embodiment shown in FIG. 1B, the fasteners 156 apply a force against the clamping member 154 through a spring 157 or similar component. In this way, the clamping member 154 applies a spring-loaded clamping force against the heat pipe 140. In other words, the clamping member 154 maintains a force against the heat pipe 140 while still providing a limited freedom of movement, or "play" to the heat pipe 140 in a direction normal to the surface of the primary electronics assembly 110. Such freedom of movement is beneficial for interfacing with the electronics modules 120 for the reasons discussed in greater detail below.

In one embodiment, in operation, at least some thermal energy generated by the electronics modules 120 is transferred to the base member 152 of the floating heat pipe interface 150 and then to segment 142 of the heat pipe 140. The clamping force applied by the clamping member 154 onto the heat pipe 140 maintains solid physical contact between the base member 152 and the heat pipe 140 such that at least some heat absorbed by the base member 152 is conductively transferred into a phase change fluid (for example, water) within the heat pipe 140. At least some of the heat absorbed by the fluid within the heat pipe causes the fluid to boil into a vapor that transports the absorbed heat from the second segment 142 to the first segment 141 of the heat pipe 140 located within the floating heat sink 130. Heat is transferred from the first segment 141 to the heat sink 130 as the vaporized phase change fluid condenses back into a liquid fluid that circulates back to the second segment 142 to repeat this heat transfer cycle. The phase change of the vapor back to a liquid dissipates the heat into the heat sink 130 in a process referred to as the latent heat of vaporization.

Referring back to FIG. 1, the transfer of at least some heat from the electronics module 120 to the floating heat pipe interface 150 is carried through one or more heat conduction risers 125 embedded within the structure of each electronics modules 120. The heat conduction risers 125 each extend out from the electronics module 120 and are positioned on the module 120 at a point where they align and contact with the base member 152 when the electronics module 120 is inserted into a module bay 112 of the primary electronics assembly 110.

Figure 2:
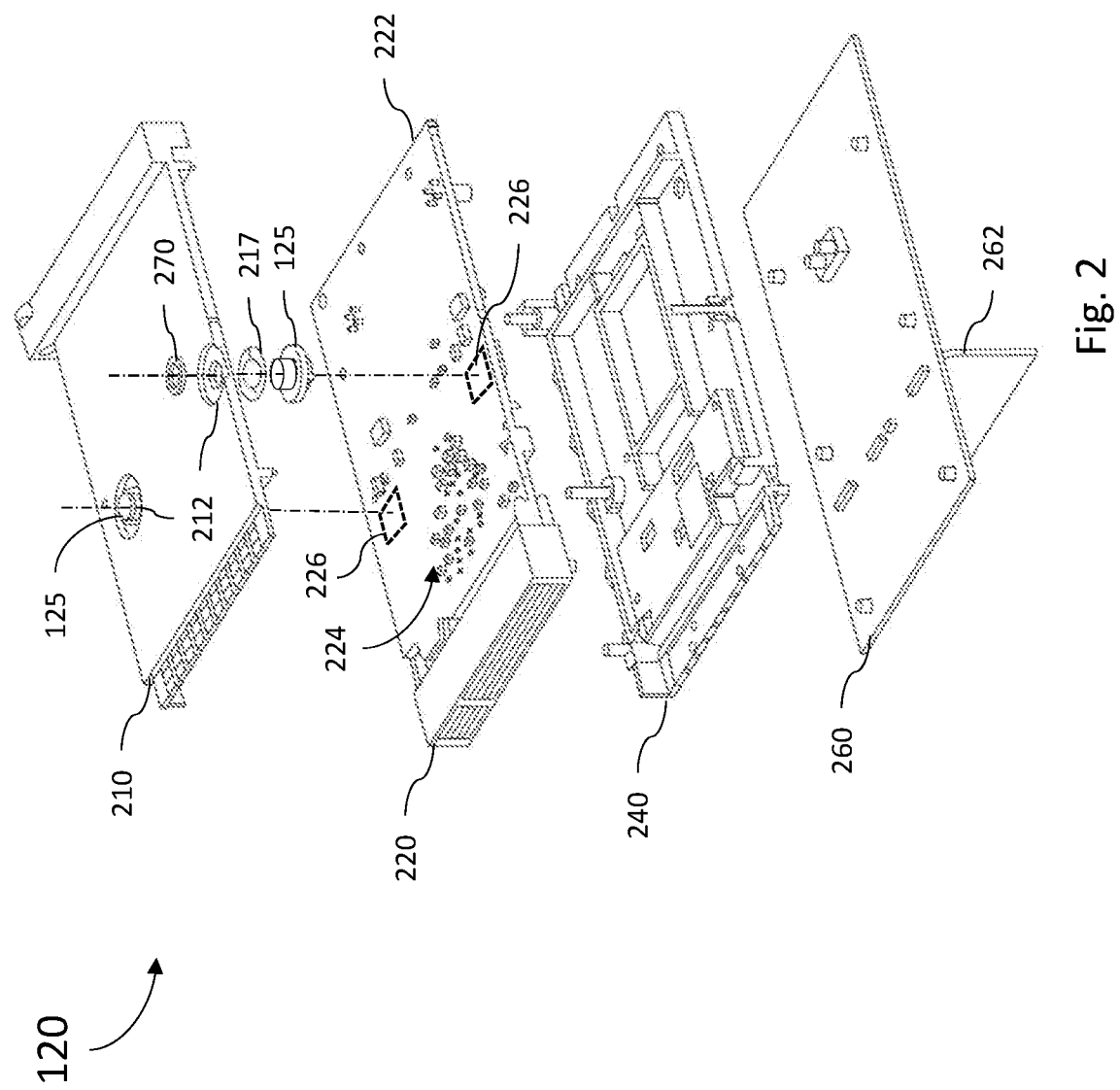
FIG. 2 is a diagram illustrating an exploded view of an example electronics module embodiment.

FIG. 2 is an exploded view of an isometric diagram illustrating an example of an electronics module 120 of the present disclosure. In FIG. 2, the electronics module 120 is shown separated into four component parts including a module cover 210 (which may also function as a local heat sink for the module 120) and an electronics board 220 (which may comprise a printed circuit board 222 populated with electronic components 224). For those embodiments where an electronics module 120 includes electronic components 224 that perform RF functions, the module 120 may further include an RF shield board 240 (to provide RF shield of those electronic circuits that perform RF functions) and an antenna board 260 (which may include at least one antenna 262 electronically coupled to those RF electronic circuits of the electronic board 220).

As shown in FIG. 2, the electronics module 120 includes one or more heat conduction risers 125 that penetrate through openings 212 formed in the module cover 210 at positions that align with a base member 152 when the electronics module 120 is inserted into a module bay 112. Accordingly, a heat conduction riser 125 that protrudes through said opening 212 will also align with that base member 152 when the electronics module 120 is inserted into a module bay 112. The opposing end of the heat conduction riser 125 (i.e., the end that does not protrude through opening 212) is in physical contact with the electronics board 220. For example, such contact may include contact with the printed circuit board 222 or contact with one or more of the electronic components 224. Each heat conduction riser 125 in contact with the electronics board 220 will therefore absorb at least some heat generated by the electronics board 220 and transfer that heat to the base member 152 of a floating heat pipe interface 150 for dissipation into the environment by a floating heat sink 130.

In some embodiments, a high power component 226 that generate relatively more heat than others on the electronics board 220 may be positioned on the electronics board 220 to align with the position of a heat conduction riser 125 to better facilitate the efficient removal of heat from such components from the electronics module 120. For example, the heat conduction riser 125 may directly contact such high power component or directly contact the opposing side of the electronics board 220 directly opposite to where the high power component is mounted. In some embodiments, the electronics module 120 may comprise multiple heat conduction risers 125 that contact the electronics board 220 in this manner. In some embodiments, multiple heat conduction risers 125 may interface with a common base member 152 of a floating heat pipe interface 150. In other embodiments, a single heat conduction riser 125 may interface with a corresponding base member 152 of a floating heat pipe interface 150.

Figure 2A:
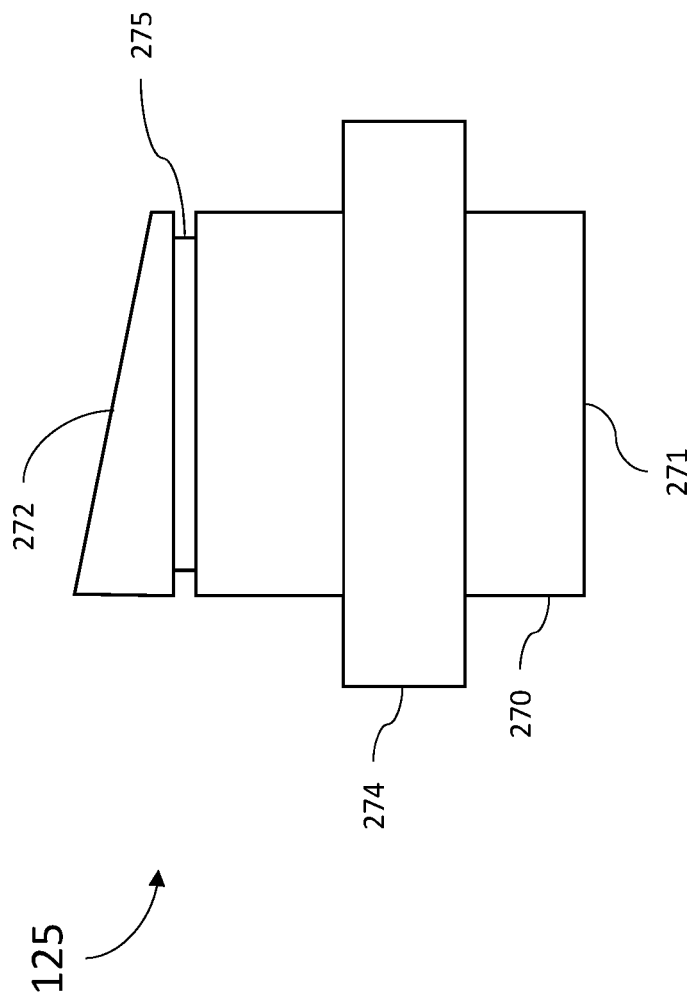
FIG. 2A is a diagram illustrating an example heat conduction riser embodiment.

An example heat conduction riser 125 is illustrated in FIG. 2A. In this example embodiment, the heat conduction riser 125 comprises a base 270 with a lower interfacing surface 271 that is in physical contact with the electronics board 220 as described above. The opposing end of the heat conduction riser 125 that protrudes through the opening 212 of cover 210 includes an upper interfacing surface 272 that comes into contact with the base member 152 when the electronics module 120 is installed into a module bay 112 of the primary electronics assembly 110. As indicated in FIG. 2A, the upper interfacing surface 272 may be scarfed or angled to have an angle that matches the angle of the surface of the base member 152 (for reasons described in greater detail below). The heat conduction riser 125 may also comprise a stop projection 274 that remains inside the module cover 210 and is sized greater than the diameter of the opening 212 to function as a stop to limit how much the heat conduction riser 125 can extend out from the module cover 210. The heat conduction riser 125 may be further secured by a retaining ring 276 that clips into a recessed slot 275 in the riser 125 accessible from the outside of the module cover 210. Like the clamping member 154, the heat conduction riser 125 may also be spring loaded, for example by a spring washer 217 positioned between the stop projection 274 and the module cover 210 to apply and maintain a positive force from the heat conduction riser 125 onto the electronics board 220 while still having a limited freedom of movement, or "float" in order to accommodate manufacturing tolerances and minor dimensional deviations between individual electronics modules 120 that may be used in conjunction with the primary electronics assembly 110. The conduction riser 125 may be fabricated from any material having a high coefficient of thermal conductivity, such as but not limited to copper, aluminum, or other metals and alloys, ceramics, graphite, or thermally conductive composites. The particular materials used for the riser 125, and its particular shape and dimensions, may be readily determined as a function of the desired heat transfer rate, the amount of heat to be dissipated, and the surface area available on the electronics board 220 for the heat conduction riser 125 to interface with. Similarly, the number of heat conduction riser 125 provided for a particular desired electronics module 120 may be readily as a function of the desired heat transfer rate, the amount of heat to be dissipated, and the surface area available on the electronics board 220.

Figure 3:
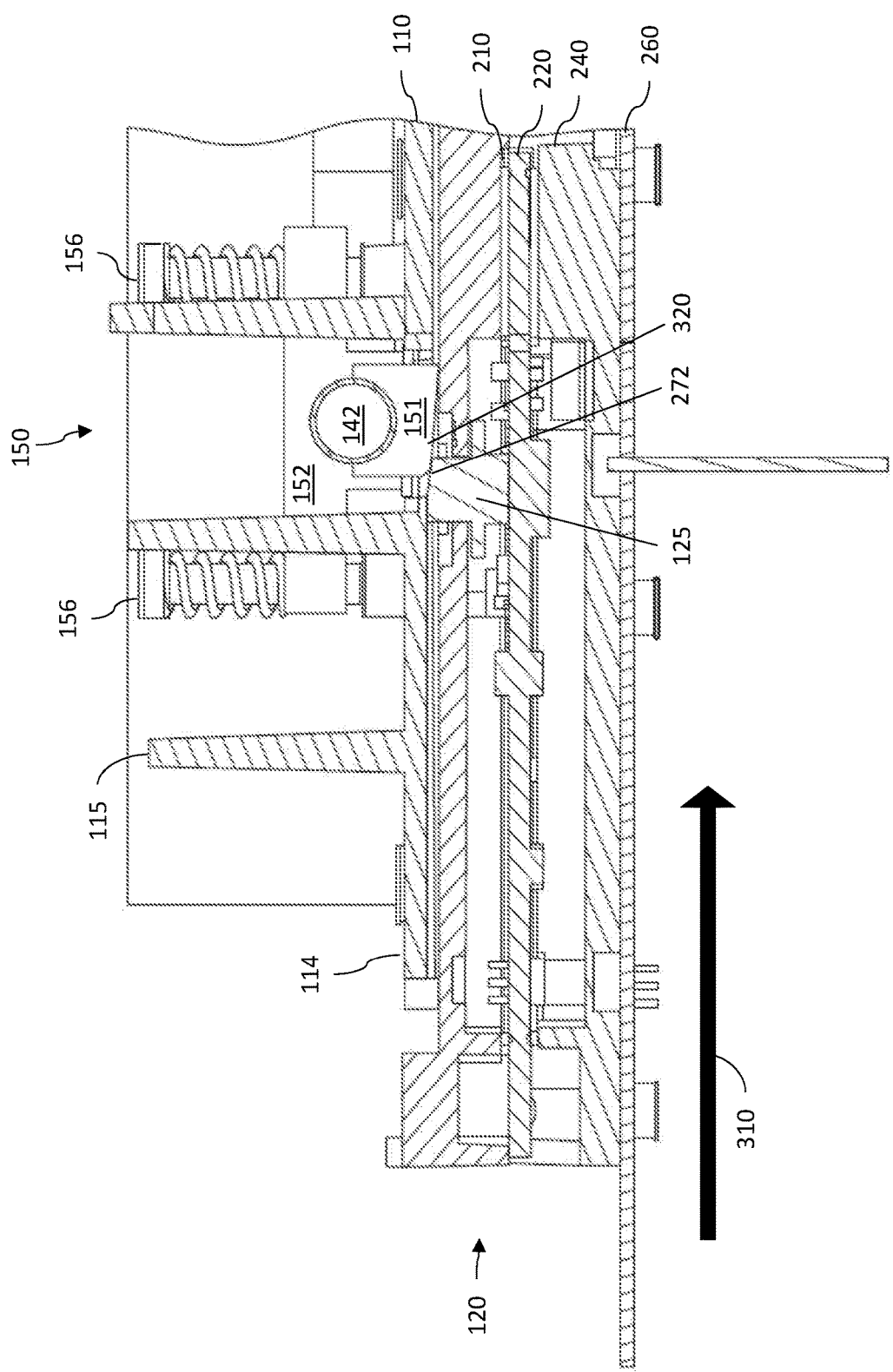
FIG. 3 is a diagram illustrating insertion of an example electronics module into a primary electronics assembly for an example modular device embodiment.

FIG. 3 is a diagram illustrating an example of the insertion of an electronics module 120 into a module bay 112 of the primary electronics assembly 110. As the electronics module 120 sides into a module bay 112 (represented by the arrow 310), the angled upper interfacing surface 272 of the heat conduction riser 125 comes into contact with an angled surface 320 of the base member 152. The angles of the upper interfacing surface 272 and angled surface 320 are matched so that the two surfaces are in contact across an interfacing plane that increase in area as the electronics module 120 is further inserted. In some embodiments, the heat conduction riser 125 may be constrained from rotating in place so that the two surfaces will be properly aligned when the electronics module 120 is installed.

As the electronics module 120 slides in, the two interfaces contact and with the aid of the angles, and a force is created pushing the base member 152 up, countering the spring loading force created by the fasteners 156 apply against the clamping member 154. This allows the heat pipe 140 to self-adjust in position as the electronics module 120 is installed to avoid bending stresses that could result in damage to the heat pipe 140 if it were instead rigidly mounted. The floating design also better accommodates movement of the components due to thermal expansion. The heat pipe essentially floats on a spring mounted system that allows the two interfaces of the floating heat pipe interface 150 and heat conduction risers 125 to engage and transfer heat from the electronics board 220 to the heat pipe 140 and to the floating heat sinks 130.

Figure 4:
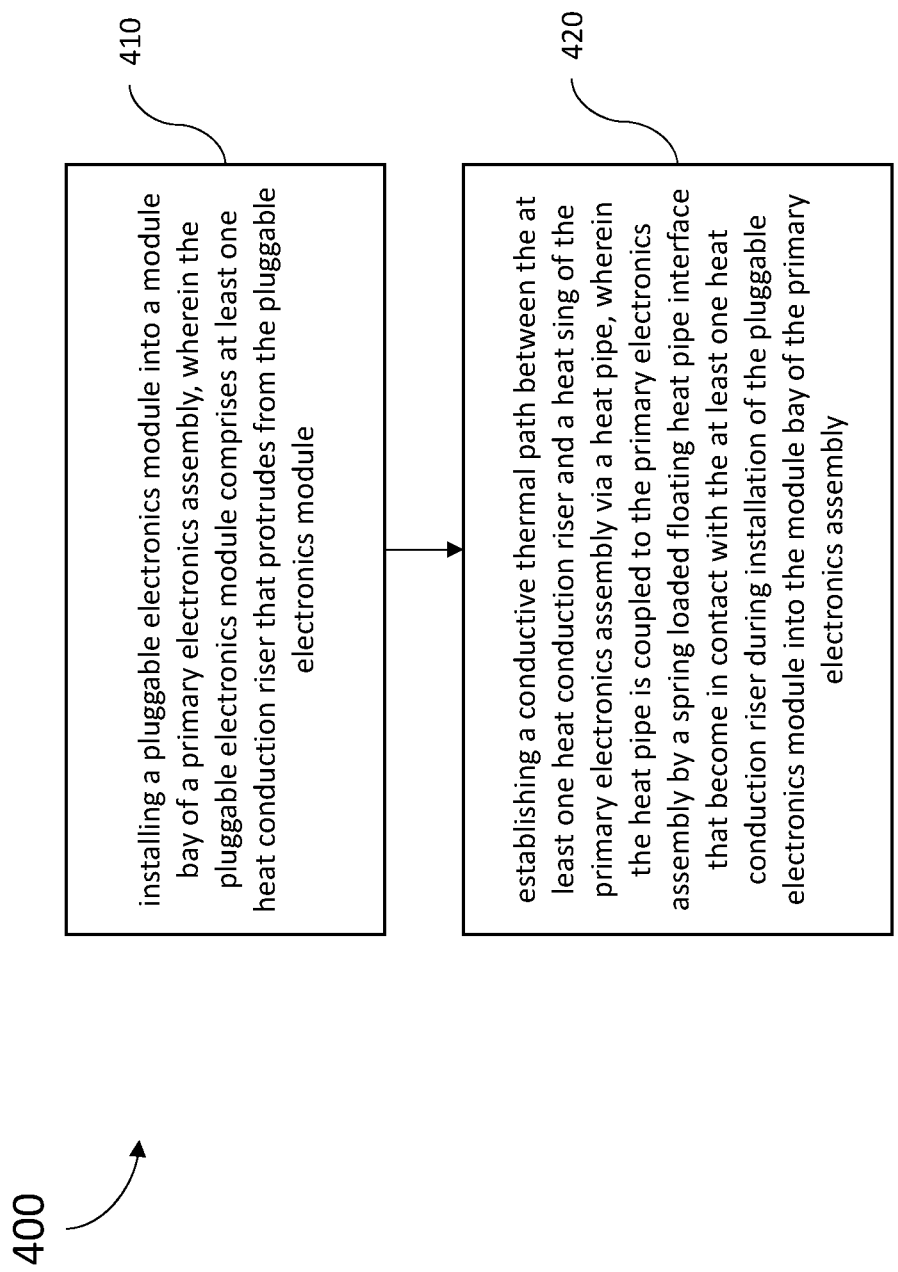
FIG. 4 is a flow chart illustrating thermal management method for a modular electronics device.

FIG. 4 is a flow chart illustrating thermal management method 400 for a modular electronics device. It should be understood that the features and elements described herein with respect to the method 400 shown in FIG. 4 and the accompanying description may be used in conjunction with, in combination with, or substituted for elements of any of the other embodiments discussed with respect to the other figures, or elsewhere herein, and vice versa. Further, it should be understood that the functions, structures and other description of elements associated with embodiments of FIG. 4 may apply to like named or described elements for any of the other figures and embodiments and vice versa.

The method begins at 410 with installing a pluggable electronics module into a module bay of a primary electronics assembly, wherein the pluggable electronics module comprises at least one heat conduction riser that protrudes from the pluggable electronics module. In some embodiments the heat conduction risers 125 each extend out from the electronics module 120 and are positioned on the module 120 at a point where they align and contact with the base member 152 when the electronics module 120 is inserted into a module bay 112 of the primary electronics assembly 110. The method proceeds to 420 with establishing a conductive thermal path between the at least one heat conduction riser and a heat sing of the primary electronics assembly via a heat pipe, wherein the heat pipe is coupled to the primary electronics assembly by a spring loaded floating heat pipe interface that become in contact with the at least one heat conduction riser during installation of the pluggable electronics module into the module bay of the primary electronics assembly. The spring loaded floating heat pipe interface applies a clamping force against the heat pipe, and maintains contact between the spring loaded floating heat pipe interface and the at least one heat conduction riser. As described above, in some embodiments, the second heat management mechanism for device 100 comprises one or more floating heat sinks 130 which serve the function of drawing and dissipating at least some heat generated by the pluggable electronics module(s) 120. More specifically, each floating heat sink 130 is thermally coupled to an electronics module 120 by a heat pipe 140 that defines a direct thermal conductive heat path between the electronics module 120 and the floating heat sink 130. A clamping force is applied to secure the heat pipe 140 within the floating heat pipe interface 150 by a plurality of fasteners 156 that pass through the clamping member 154 and fasten into the primary electronics assembly 110. For example, in one embodiment the one or more of the fasteners 156 may comprise a threaded fastener that applies a clamping force onto the clamping member 154 as they are tightened in place.

Example Embodiments

Example 1 includes a modular electronic device, the device comprising: a primary electronics assembly comprising at least one module bay configured to receive a pluggable electronics module, wherein the pluggable electronics module comprises at least one heat conduction riser that protrudes from the pluggable electronics module; a heat management mechanism coupled to the primary electronics assembly, wherein the heat management mechanism includes at least one floating heat sink thermally coupled to the at least one heat conduction riser of the pluggable electronic module by a heat pipe that defines a direct thermal conductive heat path between the pluggable electronics module and the at least one floating heat sink; wherein the heat pipe is mounted to the primary electronics assembly by a spring loaded floating heat pipe interface that applies a clamping force against the heat pipe, and maintains contact between the spring loaded floating heat pipe interface and the at least one heat conduction riser.

Example 2 includes the device of example 1, wherein the spring loaded floating heat pipe interface comprises: a base member having an angled surface configured to physically interface with an upper interfacing surface of the at least one heat conduction riser; and a clamping member; wherein a first segment of the heat pipe is positioned between the base member and the clamping member.

Example 3 includes the device of example 2, wherein the spring loaded floating heat pipe interface further comprises: one or more fasteners; wherein the one or more fasteners apply a spring loaded clamping force onto the clamping member and the clamping member applies the clamping force to secure the heat pipe within the spring loaded floating heat pipe interface.

Example 4 includes the device of any of examples 2-3, wherein the upper interfacing surface comprises an angled surface having an angle that matches that of the angled surface of the base member.

Example 5 includes the device of example 4, wherein the at least one heat conduction riser is configured not to rotate.

Example 6 includes the device of any of examples 2-5, wherein the at least one floating heat sink comprises a cavity, wherein a second segment of the heat pipe is inserted into the cavity.

Example 7 includes the device of any of examples 1-6, wherein the primary electronics assembly further comprises a fixed heat sink.

Example 8 includes the device of any of examples 1-7, wherein the pluggable electronics module further comprises: a module cover; and an electronics board; wherein a first surface of the at least one heat conduction riser contacts the electronics boards and a second surface of the at least one heat conduction riser protrudes through an opening of the module cover.

Example 9 includes the device of example 8, wherein the at least one heat conduction riser is spring loaded to maintain a positive force from the heat conduction riser onto the electronics board.

Example 10 includes the device of any of examples 8-9, wherein the electronics board comprise a printed circuit board populated with electronic components.

Example 11 includes the device of any of examples 1-10, wherein the pluggable electronics module further comprises radio frequency (RF) electronics circuits.

Example 12 includes the device of example 11, wherein the pluggable electronics module further comprises one or both of a radio frequency (RF) shield board, and an antenna board.

Example 13 includes the device of any of examples 1-12, wherein the heat conduction riser comprises: a base having a first surface in contact with an electronics board of the pluggable electronics module; and a second surface on an opposing end of the base from the first surface, the second surface configured to contact a base member of the spring loaded floating heat pipe interface when the pluggable electronics module is installed within the at least one module bay.

Example 14 includes the device of any of examples 1-13, wherein the heat conduction riser comprises at least one of: copper, aluminum, a metal alloy, a ceramic material, a graphite material, or a thermally conductive composite material.

Example 15 includes the device of any of examples 1-14, wherein the pluggable electronics module comprises more than one conduction riser that protrudes from the module cover and maintains contact with the spring loaded floating heat pipe interface.

Example 16 includes a thermal management method for a modular electronics device, the method comprising: installing a pluggable electronics module into a module bay of a primary electronics assembly, wherein the pluggable electronics module comprises at least one heat conduction riser that protrudes from the pluggable electronics module; establishing a conductive thermal path between the at least one heat conduction riser and a heat sing of the primary electronics assembly via a heat pipe, wherein the heat pipe is coupled to the primary electronics assembly by a spring loaded floating heat pipe interface that become in contact with the at least one heat conduction riser during installation of the pluggable electronics module into the module bay of the primary electronics assembly; wherein the spring loaded floating heat pipe interface applies a clamping force against the heat pipe, and maintains contact between the spring loaded floating heat pipe interface and the at least one heat conduction riser.

Example 17 includes the method of example 16, wherein the spring loaded floating heat pipe interface comprises: a base member having an angled surface configured to physically interface with an upper interfacing surface of the at least one heat conduction riser; and a clamping member, wherein a first segment of the heat pipe is positioned between the base member and the clamping member; wherein the upper interfacing surface comprises an angled surface having an angle that matches that of the angled surface of the base member.

Example 18 includes the method of example 17, wherein the spring loaded floating heat pipe interface further comprises: one or more fasteners; wherein the one or more fasteners apply a spring loaded clamping force onto the clamping member and the clamping member applies the clamping force to secure the heat pipe within the spring loaded floating heat pipe interface.

Example 19 includes the method of any of examples 16-18, wherein the pluggable electronics module further comprises: a module cover; and an electronics board; wherein a first surface of the at least one heat conduction riser contacts the electronics boards and a second surface of the at least one heat conduction riser protrudes through an opening of the module cover.

Example 20 includes the method of example 19, wherein the at least one heat conduction riser is spring loaded to maintain a positive force from the heat conduction riser onto the electronics board.

As used herein, terms such as "modular electronic device", "electronics assembly", "module bay", "pluggable electronics module", "heat conduction riser", "heat management mechanism", "heat pipe", "heat pipe interface", "electronics circuit(s)", refer to hardware elements that would be recognized and understood by those of skill in the art of electronics and are not used herein as generic placeholders, nonce words or nonce terms for the purpose of invoking 35 U.S.C. 112(f).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the presented embodiments. Therefore, it is manifestly intended that embodiments be limited only by the claims and the equivalents thereof.

What is claimed is:

1. A modular electronic device, the device comprising:
    a primary electronics assembly comprising at least one module bay configured to receive a pluggable electronics module, wherein the pluggable electronics module comprises at least one heat conduction riser that protrudes from the pluggable electronics module; and
    a heat management mechanism coupled to the primary electronics assembly, wherein the heat management mechanism includes at least one floating heat sink thermally coupled to the at least one heat conduction riser of the pluggable electronics module by a heat pipe that defines a direct thermal conductive heat path between the pluggable electronics module and the at least one floating heat sink;
    wherein the heat pipe is mounted to the primary electronics assembly by a spring loaded floating heat pipe interface that applies a clamping force against the heat pipe, and maintains contact between the spring loaded floating heat pipe interface and the at least one heat conduction riser.

2. The device of claim 1, wherein the spring loaded floating heat pipe interface comprises:
    a base member having an angled surface configured to physically interface with an upper interfacing surface of the at least one heat conduction riser; and
    a clamping member;
    wherein a first segment of the heat pipe is positioned between the base member and the clamping member.

3. The device of claim 2, wherein the spring loaded floating heat pipe interface further comprises:
    one or more fasteners;
    wherein the one or more fasteners apply a spring loaded clamping force onto the clamping member and the clamping member applies the clamping force to secure the heat pipe within the spring loaded floating heat pipe interface.

4. The device of claim 2, wherein the upper interfacing surface comprises an angled surface having an angle that matches that of the angled surface of the base member.

5. The device of claim 4, wherein the at least one heat conduction riser is configured not to rotate.

6. The device of claim 2, wherein the at least one floating heat sink comprises a cavity, wherein a second segment of the heat pipe is inserted into the cavity.

7. The device of claim 1, wherein the primary electronics assembly further comprises a fixed heat sink.

8. The device of claim 1, wherein the pluggable electronics module further comprises:
    a module cover; and
    an electronics board;
    wherein a first surface of the at least one heat conduction riser contacts the electronics board and a second surface of the at least one heat conduction riser protrudes through an opening of the module cover.

9. The device of claim 8, wherein the at least one heat conduction riser is spring loaded to maintain a positive force from the heat conduction riser onto the electronics board.

10. The device of claim 8, wherein the electronics board comprise a printed circuit board populated with electronic components.

11. The device of claim 1, wherein the pluggable electronics module further comprises radio frequency (RF) electronics circuits.

12. The device of claim 11, wherein the pluggable electronics module further comprises one or both of a radio frequency (RF) shield board, and an antenna board.

13. The device of claim 1, wherein the at least one heat conduction riser comprises:
    a base having a first surface in contact with an electronics board of the pluggable electronics module; and
    a second surface on an opposing end of the base from the first surface, the second surface configured to contact a base member of the spring loaded floating heat pipe interface when the pluggable electronics module is installed within the at least one module bay.

14. The device of claim 1, wherein the at least one heat conduction riser comprises at least one of:
    copper, aluminum, a metal alloy, a ceramic material, a graphite material, or a thermally conductive composite material.

15. The device of claim 1, wherein the pluggable electronics module comprises more than one conduction riser that protrudes from a module cover and maintains contact with the spring loaded floating heat pipe interface.

16. A thermal management method for a modular electronics device, the method comprising:
    installing a pluggable electronics module into a module bay of a primary electronics assembly, wherein the pluggable electronics module comprises at least one heat conduction riser that protrudes from the pluggable electronics module; and
    establishing a conductive thermal path between the at least one heat conduction riser and a heat sing of the primary electronics assembly via a heat pipe, wherein the heat pipe is coupled to the primary electronics assembly by a spring loaded floating heat pipe interface that become in contact with the at least one heat conduction riser during installation of the pluggable electronics module into the module bay of the primary electronics assembly;
    wherein the spring loaded floating heat pipe interface applies a clamping force against the heat pipe, and maintains contact between the spring loaded floating heat pipe interface and the at least one heat conduction riser.

17. The method of claim 16, wherein the spring loaded floating heat pipe interface comprises:

a base member having an angled surface configured to physically interface with an upper interfacing surface of the at least one heat conduction riser; and a clamping member, wherein a first segment of the heat pipe is positioned between the base member and the clamping member;

wherein the upper interfacing surface comprises an angled surface having an angle that matches that of the angled surface of the base member.

18. The method of claim 17, wherein the spring loaded floating heat pipe interface further comprises:

one or more fasteners;

wherein the one or more fasteners apply a spring loaded clamping force onto the clamping member and the clamping member applies the clamping force to secure the heat pipe within the spring loaded floating heat pipe interface.

19. The method of claim 16, wherein the pluggable electronics module further comprises:

a module cover; and an electronics board;

wherein a first surface of the at least one heat conduction riser contacts the electronics board and a second surface of the at least one heat conduction riser protrudes through an opening of the module cover.

20. The method of claim 19, wherein the at least one heat conduction riser is spring loaded to maintain a positive force from the at least one heat conduction riser onto the electronics board.

* * * * *